(12) United States Patent
Hamada et al.

(10) Patent No.: US 8,014,169 B2
(45) Date of Patent: Sep. 6, 2011

(54) SHIELD STRUCTURE FOR ELECTRONIC DEVICE

(75) Inventors: Seiji Hamada, Osaka (JP); Masaaki Ofuji, Osaka (JP); Takatoshi Kubiura, Hyogo (JP); Ichiro Hirose, Osaka (JP); Hirotsugu Fusayasu, Kyoto (JP); Ryo Matsubara, Osaka (JP); Kei Ichikawa, Osaka (JP); Hiroshi Kunimoto, Osaka (JP)

(73) Assignee: Panasonic Corporation, Osaka (JP)

( * ) Notice: Subject to any disclaimer, the term of this patent is extended or adjusted under 35 U.S.C. 154(b) by 497 days.

(21) Appl. No.: 12/327,220

(22) Filed: Dec. 3, 2008

(65) Prior Publication Data

US 2009/0141470 A1 Jun. 4, 2009

(30) Foreign Application Priority Data

Dec. 4, 2007 (JP) ................................. 2007-313088

(51) Int. Cl.
*H05K 9/00* (2006.01)
(52) U.S. Cl. ........................................ 361/816; 174/377
(58) Field of Classification Search .................. 361/816, 361/800; 174/350, 377
See application file for complete search history.

(56) References Cited

U.S. PATENT DOCUMENTS

| | | | | |
|---|---|---|---|---|
| 6,560,124 B1 * | 5/2003 | Irie et al. ...................... | 361/816 |
| 6,813,159 B2 * | 11/2004 | Irie et al. ...................... | 361/752 |
| 6,884,936 B2 * | 4/2005 | Takahashi et al. ............ | 174/389 |
| 7,034,220 B2 * | 4/2006 | Kim et al. ..................... | 361/816 |
| 7,274,559 B2 * | 9/2007 | Kim .......................... | 361/679.27 |
| 7,324,353 B2 * | 1/2008 | Satoh et al. ................... | 361/816 |
| 7,468,887 B2 * | 12/2008 | Han et al. ...................... | 361/719 |
| 7,545,632 B2 * | 6/2009 | Cho .......................... | 361/679.27 |
| 7,609,531 B2 * | 10/2009 | Xia et al. ...................... | 361/816 |
| 7,679,889 B2 * | 3/2010 | Sakata ..................... | 361/679.01 |
| 7,684,174 B2 * | 3/2010 | Yamate .................... | 361/679.01 |
| 7,692,918 B2 * | 4/2010 | Choi et al. ............... | 361/679.21 |
| 7,777,400 B2 * | 8/2010 | Kim .................................. | 313/36 |
| 7,796,378 B2 * | 9/2010 | Jang et al. ............... | 361/679.22 |
| 7,889,515 B2 * | 2/2011 | Boetto et al. .................. | 361/818 |
| 7,898,506 B2 * | 3/2011 | Fukui .............................. | 345/60 |
| 2005/0117283 A1 * | 6/2005 | Lee et al. ..................... | 361/681 |
| 2006/0061945 A1 * | 3/2006 | Kim .................................. | 361/681 |
| 2006/0132946 A1 * | 6/2006 | Kim et al. ..................... | 359/885 |
| 2007/0171622 A1 * | 7/2007 | Cho .............................. | 361/816 |

(Continued)

FOREIGN PATENT DOCUMENTS

JP 7-14697 U 3/1995

(Continued)

*Primary Examiner* — Lisa Lea Edmonds
(74) *Attorney, Agent, or Firm* — Hamre, Schumann, Mueller & Larson, P.C.

(57) ABSTRACT

The present invention provides a shield structure for an electronic device allowing conductive members to be connected electrically to each other at low impedance while preventing the leakage of electromagnetic waves effectively. The first conductive member and the second conductive member for enclosing the electronic device respectively have laid portions that are laid one on the other and fastened to each other at plural positions by means of screw members. Through-holes into which the screw members are to be inserted are formed on both of the laid portions. Protruding portions, which protrude toward the laid portion of the second conductive member, each are formed between the adjacent through-holes on the laid portion of the first conductive member. The protruding portions each have a shape extending in the direction connecting the adjacent through-holes and bulging from both ends toward the center thereof in a smooth curve.

10 Claims, 3 Drawing Sheets

U.S. PATENT DOCUMENTS

| | | | |
|---|---|---|---|
| 2008/0123272 A1* | 5/2008 | Kang | 361/681 |
| 2008/0170359 A1* | 7/2008 | Kim et al. | 361/681 |
| 2008/0285222 A1* | 11/2008 | Yeo et al. | 361/681 |
| 2008/0298003 A1* | 12/2008 | Pyo | 361/681 |
| 2009/0108753 A1* | 4/2009 | Matsubara et al. | 313/582 |
| 2009/0135577 A1* | 5/2009 | Jeong | 361/816 |

FOREIGN PATENT DOCUMENTS

| | | |
|---|---|---|
| JP | 2001-141972 A | 5/2001 |

* cited by examiner

SHIELD STRUCTURE FOR ELECTRONIC DEVICE

BACKGROUND OF THE INVENTION

1. Field of the Invention

The present invention relates to a shield structure for an electronic device for blocking radiation of electromagnetic waves emitted from the electronic device.

2. Related Background Art

An electronic device such as a plasma display panel (hereinafter referred to as a "PDP") is equipped with a lot of electronic components that generate electromagnetic waves. In recent years, with the digitization and enhanced performance of electronic devices, unnecessary radiation of electromagnetic waves emitted therefrom has increased. As a countermeasure against these unnecessary electromagnetic waves to ensure the electromagnetic compatibility (EMC), a shield structure in which such an electronic device is enclosed with a conductive member has been proposed.

For example, in a plasma display device including a PDP, a film having a conductive layer is disposed at the front side of the PDP and a conductive back cover is disposed at the rear side of the PDP, and the periphery of the film and the periphery of the back cover are connected electrically to each other with a frame-shaped pressing metal member (see, for example, JP 2001-141972 A). More specifically, the pressing metal member has a contact portion having a shape to be fitted along the periphery of the film and a flange portion having a shape to be fitted along the periphery of the back cover. The flange portion of the metal member and the periphery of the back cover are laid one on the other in the thickness direction of the PDP and fastened to each other at plural positions by means of screw members.

In the above-mentioned structure, the flange portion of the metal member and the periphery of the back cover, at positions where they are fastened to each other by the screw members, are brought into surface contact with each other by the fastening force of the screw members. However, gaps are formed between the positions where they are fastened by the screw members, and electromagnetic waves may leak outside the device through the gaps. In order to prevent the leakage, the flatness of both the surfaces of the flange portion of the metal member and the periphery of the back cover that are located at the side to be laid in contact needs be ensured with high accuracy. It is difficult, however, to ensure the flatness of such frame-shaped surfaces with high accuracy in view of both the workability of the surfaces and the difficulty in keeping the surfaces flat. Particularly, in many plasma display devices having large frame-shaped surfaces, it is very difficult to ensure the flatness of such large surfaces with high accuracy.

In view of this, as disclosed in JP 7 (1995)-14697 U, it has been proposed to dispose hemispherical contact portions between the positions where the flange portion of the metal member and the periphery of the back cover are fastened to each other by the screw members on either of them, so that they are reliably connected electrically to each other.

However, if the contact portions as mentioned above are provided on the flange portion of the metal member or the periphery of the back cover, they are in point contact with each other. Thus, the impedance between them cannot be lowered sufficiently.

SUMMARY OF THE INVENTION

Under these circumstances, it is an object of the present invention to provide a shield structure for an electronic device allowing conductive members to be connected electrically to each other at low impedance while preventing the leakage of electromagnetic waves effectively.

In order to achieve the above object, the present invention provides a shield structure including a first conductive member and a second conductive member that enclose an electronic device. In this shield structure, the first conductive member and the second conductive member respectively have laid portions that are laid one on the other and fastened to each other at plural positions by means of screw members. Through-holes into which the screw members are to be inserted are formed on the laid portion of the first conductive member and the laid portion of the second conductive member, respectively, and protruding portions each are formed between the through-holes adjacent to each other on the laid portion of the first conductive member. The protruding portions each protrude toward the laid portion of the second conductive member, and have a shape extending in a direction connecting the adjacent through-holes and bulging from both ends toward the center thereof in a smooth curve. The laid portion of the second conductive member is bent along the surfaces of the protruding portions by being pressed by the screw members.

According to the structure as described above, the protruding portions each are formed between the adjacent through-holes on the laid portion of the first conductive member, and the laid portion of the second conductive member is bent along the surfaces of these protruding portions. Therefore, even between the positions where the first and second conductive members are fastened to each other by the screw members, the protruding portions and the laid portion of the second conductive member are in contact with each other, which ensures the electrical connection between the first conductive member and the second conductive member. As a result, it is possible to prevent effectively the leakage of electromagnetic waves in the areas between the positions where the first and second conductive members are fastened by the screw members. Moreover, each of the protruding portions extends in the direction connecting the adjacent through-holes and the surface thereof is curved smoothly in the longitudinal direction thereof. Therefore, it is possible to bring the protruding portions and the laid portion of the second conductive member into contact in a linear manner along the longitudinal direction of the protruding portions. Accordingly, the present invention makes it possible to connect the first and second conductive members electrically at low impedance while preventing the leakage of electromagnetic waves effectively.

DETAILED DESCRIPTION OF THE INVENTION

Hereinafter, the preferred embodiments for carrying out the present invention will be described in detail with reference to the accompanying drawings. It should be noted, however, that the embodiments described below are merely exemplary of the present invention, and should not be construed to limit the scope of the present invention.

Figure 1:
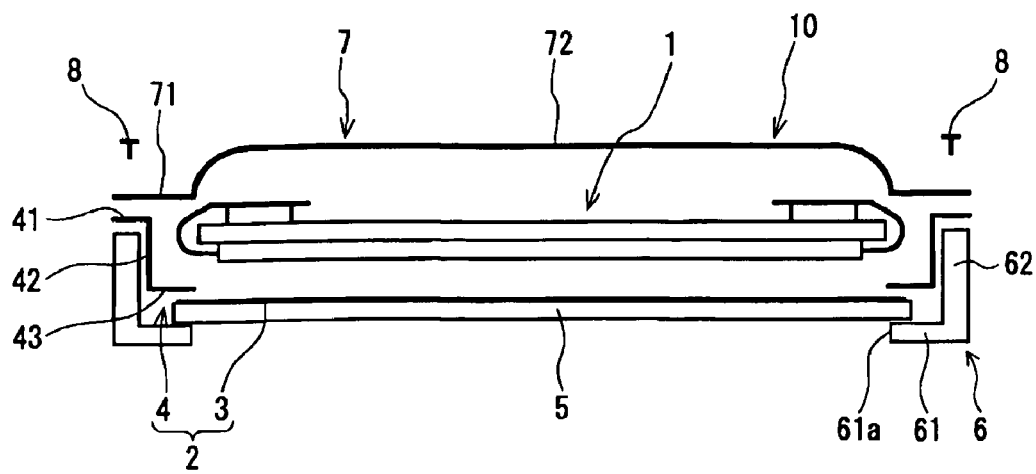
FIG. 1 is an exploded view of a schematic structure of a plasma display device employing a shield structure for an electronic device according to one embodiment of the present invention.

FIG. 1 is an exploded view of a schematic structure of a plasma display device 10 employing a shield structure for an electronic device according to one embodiment of the present invention. This plasma display device 10 includes: a PDP 1; an EMI (electromagnetic interference) film 3 disposed at the front side of the PDP 1; a transparent substrate 5 that holds the EMI film 3; a frame 6 that covers the front surface of the periphery of the transparent substrate 5; a pressing metal member 4 for pressing the periphery of the transparent substrate 5 against the frame 6 via the EMI film 3; and a back cover 7 disposed at the rear side of the PDP 1. The periphery of the back cover 7 is fixed to the frame 6 together with the pressing metal member 4 by a plurality of screw members (screws) 8. Specifically, in the present embodiment, the EMI film 3 and the pressing metal member 4 serve as a first conductive member 2 that covers the PDP 1 on the front side thereof. The back cover 7 serves as a second conductive member that covers the PDP 1 on the rear side thereof. Thus, these conductive members constitute a shield case that encloses the PDP 1 therein. As the screw members 8, bolts may be used in place of screws.

Figure 2:
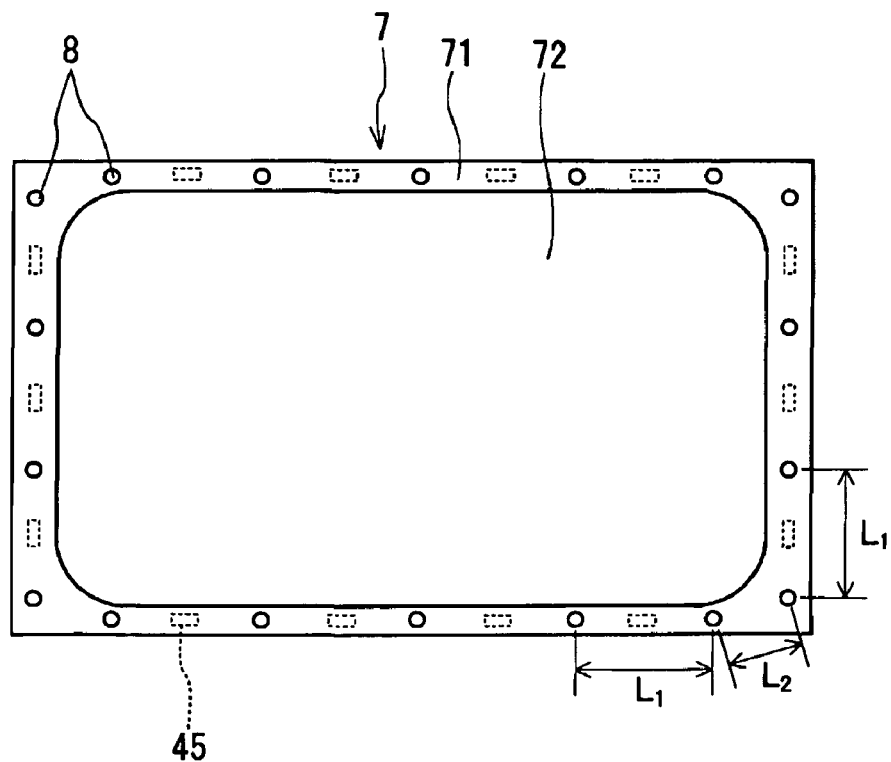
FIG. 2 is a rear view of the plasma display device shown in FIG. 1.

The frame 6 is made of resin, for example. The frame 6 has a rectangular frame shape as viewed from the front, and has four sides, each having an approximately L-shaped cross-section. Specifically, the frame 6 has a front plate 61 forming a window 61a and a peripheral wall 62 consisting of four flat-shaped wall portions and extending from the outer peripheral edge of the front plate 61 toward the rear side. Tapped holes (not shown) into which the screw members 8 are to be screwed are provided on the end surface of each wall portion of the peripheral wall 62 at a predetermined pitch. In the present embodiment, as shown in FIG. 2, the upper wall portion and the lower wall portion are each provided with five tapped holes, while the left wall portion and the right wall portion are each provided with four tapped holes, and the pitch $L_1$ between the adjacent tapped holes is set to 200 mm on all the wall portions. In the corner region where these two wall portions intersect, a center-to-center distance $L_2$ between two tapped holes, one on one wall portion and the other on the other wall portion, is about 100 mm.

The transparent substrate 5 is made of glass or resin such as acrylic resin. The EMI film 3 is attached to approximately the entire rear surface of the transparent substrate 5 located at the side of the PDP 1.

The EMI film 3 has a base layer made of a polyester film or the like and deposited on the transparent substrate 5, and a conductive layer formed on the base layer. The conductive layer is formed of a metal mesh and a metal frame surrounding the metal mesh. The EMI film 3 is attached to the transparent substrate 5 in such a manner that the conductive layer is exposed toward the PDP 1.

The back cover 7 is formed by pressing a rectangular metal plate with a thickness of 0.45 mm in such a manner that the region other than the peripheral rim of the plate bulges. Specifically, the back cover 7 has a flat and approximately rectangular frame-shaped (flanged) laid portion 71 and a dome-like bulged portion 72 that bulges from the inner peripheral edge of the laid portion 71. The bulged portion 72 faces the EMI film 3 across the PDP 1. On the laid portion 71, through-holes 73 (see FIG. 5A) into which the threaded portions of the screw members 8 are to be inserted are formed at positions corresponding to the tapped holes formed on the peripheral wall 62 of the frame 6.

The pressing metal member 4 is a frame-shaped member having four side portions each formed by pressing a long metal plate with a thickness of 1 mm. The pressing metal member 4 has a rectangular frame-shaped flange portion 41 that faces the end face of the peripheral wall 62 of the frame 6, a pressing portion 43, which has a rectangular frame shape slightly smaller than the flange portion 41, for pressing the periphery of the EMI film 3, and a rectangular cylindrical connecting portion 42 for connecting the inner peripheral edge of the flange portion 41 and the outer peripheral edge of the pressing portion 43. The flange portion 41 is to be laid on the laid portion 71 of the back cover 7 in the direction in which the EMI film 3 and the bulged portion 72 of the back cover 7 face each other (i.e., the thickness direction of the PDP 1), and corresponds to the laid portion of the first conductive member of the present invention. On this flange portion 41, through-holes 44 (see FIG. 5A) into which the threaded portions of the screw members 8 are to be inserted are formed at positions corresponding to the tapped holes formed on the peripheral wall 62 of the frame 6. Specifically, the center-to-center distance $L_3$ between adjacent through-holes 44 is identical to the pitch $L_1$ in the area where the through-holes 44 are formed on a straight line along each side of the flange portion 41. On the other hand, the distance $L_3$ is identical to the above-mentioned distance $L_2$ in the corner regions of the flange portion 41. When the laid portion 71 of the back cover 7 is laid on the flange portion 41 and the screw members 8 are screwed into the tapped holes of the frame 6 via the through-holes 44 and 73, the pressing member 43 presses the periphery of the EMI film 3, and thereby the pressing portion 43 and the EMI film 3 are connected electrically, and the flange portion 41 and the laid portion 71 are fastened to each other by the screw members 8 at plural positions in such a state that they are in surface contact with each other.

Figure 3:
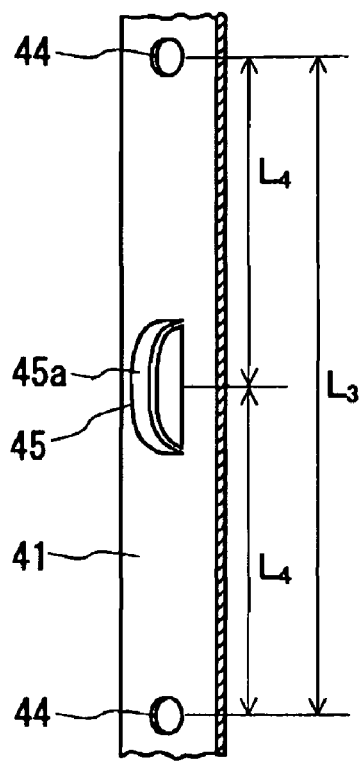
FIG. 3 is an enlarged perspective view of a part of a pressing metal member.
Figure 5A:
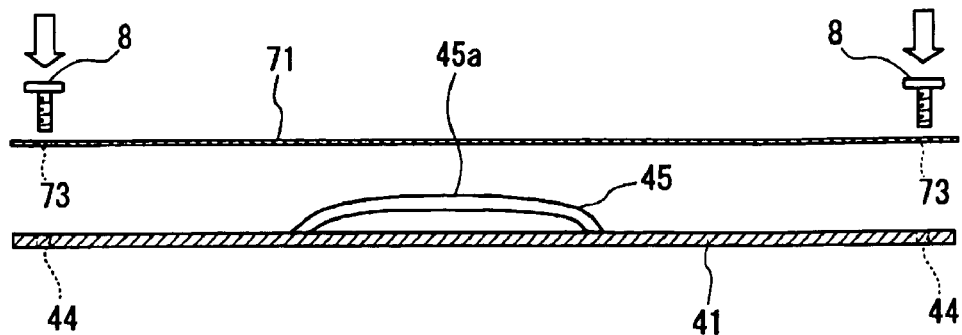
FIG. 5A is a cross-sectional view showing a state in which a flange portion of a pressing metal member and a periphery of a back cover are not yet fastened to each other by screw members.
Figure 5B:
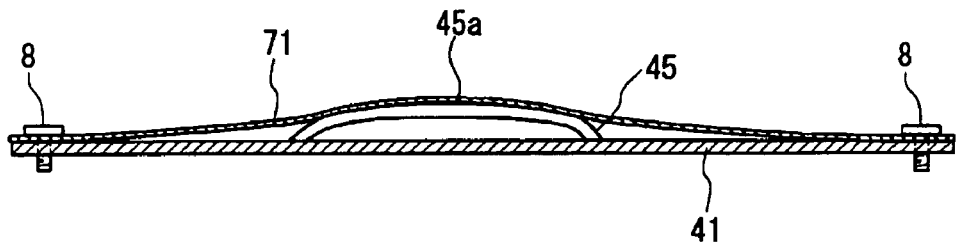
FIG. 5B is a cross-sectional view showing a state in which the flange portion of the pressing metal member and the periphery of the back cover are fastened to each other by the screw members.

Moreover, in the present embodiment, as shown in FIGS. 2 and 3, protruding portions 45 are each provided at the midpoint between adjacent through-holes 44 aligned on a straight line on the flange portion 41. Each of the protruding portions 45 protrudes from the surface of the flange portion 41 toward the laid portion 71 of the back cover 7. The laid portion 71 of the back cover 7 is flat before the screw members 8 are screwed into the tapped holes, as shown in FIG. 5A. However, when the screw members 8 are screwed into the tapped holes, the laid portion 71 is pressed by the heads of the screw members 8. As a result, in the areas around the through-holes 44, the laid portion 71 is brought into surface contact with the flange portion 41, and in the areas between the adjacent through-holes 44, it is bent along the surface 45a of each protruding portion 45, as shown in FIG. 5B.

Specifically, as shown in FIG. 3, each of the protruding portions 45 extends in the direction connecting adjacent through-holes 44, and bulges from both ends toward the center thereof in a smooth curve. That is, the protruding portion 45 has a shape like an arched plate that is bent like a bow in a side view. The surface 45a of the protruding portion 45 is curved smoothly in the longitudinal direction across a predetermined width. Specifically, the surface 45a of the protruding portion 45 is curved in one direction only (in the longitudinal direction of the protruding portion 45), and flat in the width direction thereof. Therefore, the laid portion 71 of the back cover 7 is in surface contact with the protruding portion 45 in a linear manner along the longitudinal direction of the protruding portion 45. This protruding portion 45 can be formed easily by making two parallel incisions in the flange portion 41 and extruding the portion between the incisions.

It is preferable that a center-to-center distance $L_4$ between each protruding portion 45 and the through-hole 44 closest to this protruding portion 45 is 150 mm or less. In the area where the center-to-center distance is $L_4$, the flange portion 41 and the laid portion 71 are spaced away from each other to form a slit. The slit serves as an antenna for an electromagnetic wave with a wavelength twice the length of the slit. Therefore, the distance $L_4$ preferably is 150 mm or less to block the leakage of electromagnetic waves of 1 GHz or less to the outside, which is required by the EMC Standards. In the present embodiment, since each protruding portion 45 is formed at the midpoint between adjacent through-holes 44, the distance $L_4$ is 100 mm.

It is preferable that the length of each protruding portion 45 is one tenth or more of the center-to-center distance between adjacent through-holes 44, from the viewpoint of securing a larger contact length where the protruding portion 45 is brought into contact with the laid portion 71 of the back cover 7. In the present embodiment, the length of the protruding portion 45 is set to 30 mm. The width of the protruding portion 45 can be selected as appropriate, and it is set to 7 mm in the present embodiment.

In order to prevent the leakage of electromagnetic waves of 1 GHz or less, the protruding portions 45 may be formed only in the areas where the center-to-center distance $L_3$ between adjacent through-holes 44 is 150 mm or more. By doing so, the number of the protruding portions 45 can be minimized. For example, when the through-holes 44 are not formed at a fixed pitch on a straight line along each side of the flange portion 41, the protruding portion 45 does not need to be formed in the area where the center-to-center distance $L_3$ between adjacent through-holes 44 is less than 150 mm. In the present embodiment, the protruding portions 45 are formed only in the areas where the center-to-center distance $L_3$ between adjacent through-holes 44 is 200 mm. In the corner regions where the distance $L_3$ is 100 mm, no protruding portion 45 is disposed between adjacent through-holes 44.

Figure 4:
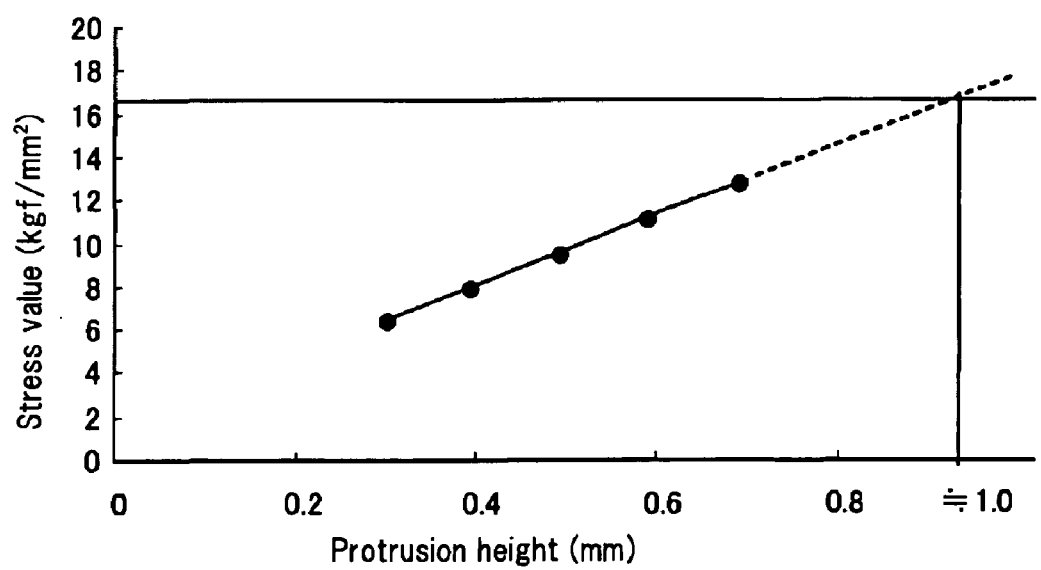
FIG. 4 is a graph showing a relationship between a central protrusion height of a protruding portion and a stress applied to a periphery of a back cover.

The center-to-center distance between adjacent through-holes 44 was set to 200 mm, and the protruding portions 45 having a length of 30 mm and a width of 7 mm were each provided in the midpoint between them. The stresses applied to the laid portion 71 of the back cover 7 were analyzed by varying the central protrusion height (i.e., the height from the surface of the flange portion 41) of these protruding portions 45. The results thereof are shown in FIG. 4. When the stress value exceeds 16.6 kgf/mm$^2$, the laid portion 71 is plastic-deformed. Thus, as is clear from FIG. 4, it is preferable that the central protrusion height of the protruding portions 45 is 1.0 mm or less. By doing so, the plastic deformation of the laid portion 71 of the back cover 7 can be prevented. In addition, even if the back cover 7 is attached and removed repeatedly, the laid portion 71 still can be brought into contact with the protruding portions 45 reliably. In the present embodiment, the central protrusion height of the protruding portions 45 is set to 0.6 mm to make allowance for reliable contact.

As is described above, in the present embodiment, the protruding portions 45 each are formed between adjacent through-holes 44 on the flange portion 41 of the pressing metal member 4, and the laid portion 71 of the back cover 7 is bent along the surfaces 45a of these protruding portions 45. Therefore, even in the areas between the positions fastened by the screw members 8, the protruding portions 45 and the laid portion 71 are brought into contact with each other, which ensures the electrical connection between the pressing metal member 4 and the back cover 7. As a result, it is possible to prevent effectively the leakage of electromagnetic waves in the areas between the positions fastened by the screw members 8. Moreover, the protruding portions 45 each extend in the direction connecting adjacent through-holes 44, and the surface thereof is curved smoothly in the longitudinal direction across a predetermined width. Therefore, it is possible to bring the protruding portions 45 and the laid portion 71 into surface contact in a linear manner along the longitudinal direction of the protruding portions 45. Accordingly, in the present embodiment, it is possible to connect the first conductive member 2 and the back cover 7, which is the second conductive member, electrically to each other at low impedance, while preventing the leakage of electromagnetic waves effectively.

Figure 6:
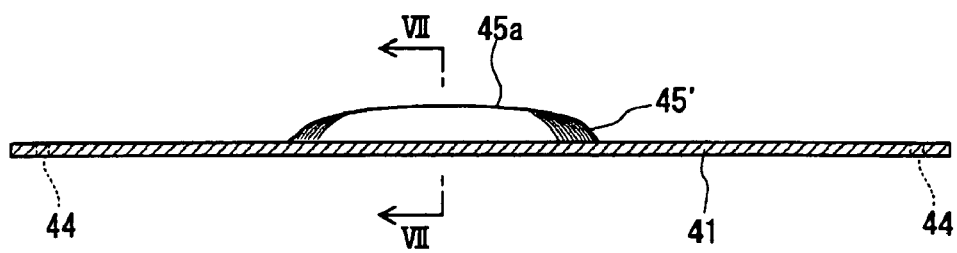
FIG. 6 is a cross-sectional view of a modified example of the pressing metal member.
Figure 7:
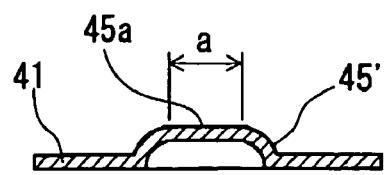
FIG. 7 is a cross-sectional view taken along a line VII-VII of FIG. 6.

Although the protruding portions 45 each have a shape like an arched plate that is bent like a bow in a side view in the present embodiment as described above, protruding portions 45' having a dome-like shape and extending in the direction connecting adjacent through-holes 44, as shown in FIGS. 6 and 7, can be provided. The dome-like shape here means a bulged shape with no opening made by an incision or the like. The surfaces 45a of these protruding portions 45' also are curved smoothly in the longitudinal direction across a predetermined width. Specifically, the surface 45a of each protruding portion 45' has a flat ridge portion that extends in the longitudinal direction thereof in a gentle curve. The protruding portion 45' having such a shape can be formed easily by a drawing process. Burrs may be formed along both sides of the plate-like protruding portion 45, and in such a case, it is necessary to remove the burrs in order to bring the protruding portion 45 into complete surface contact with the laid portion 71 of the back cover 7. On the other hand, burrs are not formed on the dome-like protruding portion 45', which makes it possible to bring the protruding portion 45' into complete surface contact with the laid portion 71 of the back cover 7, with no special steps.

Furthermore, when a corrosion-resistant film is formed on the surface of the flange portion 41 of the pressing metal member 4 by coating or plating, it is preferable that the thickness of the corrosion-resistant film formed on the surfaces of the protruding portions 45 or 45' is smaller than that of the corrosion-resistant film formed on the surface of the flange portion 41.

Moreover, the present invention also can be applied to electronic devices other than the PDP 1. In this regard, when the present invention is applied to the PDP 1, the first and second conductive members often are large in size and thus the distance between adjacent screw members 8 also is large. Therefore, the present invention is effective particularly for the PDP 1.

Furthermore, when the present invention is applied to other electronic devices, the first conductive member may be a container having a bottom that is formed of a single material. In this case, the frame 6 does not need to be provided if the through-holes formed on the first conductive member are tapped holes. When tapped holes are formed on the first conductive member as the through-holes, it is preferable that the thickness of the laid portion of the first conductive member is smaller than that of the laid portion of the second conductive member. This makes it possible to reduce the bending of the first conductive member when the screw members are screwed into the tapped holes, so that the laid portion of the second conductive member can be bent greatly along the protruding portions. As a result, a larger contact area can be secured.

The second conductive member may have a flat plate shape, or the first conductive member may have a flat plate shape and the second conductive member may have a hat shape in which an electronic device can be contained. In either case, the periphery of the flat plate-like conductive member serves as a laid portion.

Furthermore, the present invention also can be applied widely to, for example, structures in which the first and second conductive members both have a container shape and one of them is fitted into the other to form a closed space inside them. That is, the laid portions do not need to be a frame shape but may be a cylindrical shape. In this case, the laid portions are laid one on the other in the direction perpendicular to the axis direction (the axis direction in which the first and second conductive members open).

The invention may be embodied in other forms without departing from the spirit or essential characteristics thereof. The embodiments disclosed in this specification are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A shield structure for an electronic device, comprising a first conductive member and a second conductive member that enclose the electronic device,
    wherein the first conductive member and the second conductive member respectively have laid portions that are laid one on the other and fastened to each other at plural positions by means of screw members,
    through-holes into which the screw members are to be inserted are formed on the laid portion of the first conductive member and the laid portion of the second conductive member, respectively, and protruding portions each are formed between the through-holes adjacent to each other on the laid portion of the first conductive member, the protruding portions each protruding toward the laid portion of the second conductive member, and having a shape extending in a direction connecting the adjacent through-holes and bulging from both ends toward the center thereof in a smooth curve, and
    the laid portion of the second conductive member is bent along the surfaces of the protruding portions by being pressed by the screw members.

2. The shield structure for an electronic device according to claim 1,
    wherein the surfaces of the protruding portions each are curved smoothly in a longitudinal direction thereof across a predetermined width.

3. The shield structure for an electronic device according to claim 1,
    wherein the laid portion of the second conductive member has a thickness smaller than that of the laid portion of the first conductive member.

4. The shield structure for an electronic device according to claim 1,
    wherein a center-to-center distance between each of the protruding portions and the through-hole closest to the protruding portion is 150 mm or less.

5. The shield structure for an electronic device according to claim 4,
    wherein the protruding portions each are formed in an area where a center-to-center distance between the adjacent through-holes is 150 mm or more.

6. The shield structure for an electronic device according to claim 4,
    wherein the protruding portions each have a length one tenth or more of a center-to-center distance between the adjacent through-holes.

7. The shield structure for an electronic device according to claim 1,
    wherein the protruding portions each have a central protrusion height of 1.0 mm or less.

8. The shield structure for an electronic device according to claim 1,
    wherein the protruding portions each have a dome-like shape formed by a drawing process.

9. The shield structure for an electronic device according to claim 1,
    wherein the electronic device is a plasma display panel.

10. The shield structure for an electronic device according to claim 9,
    wherein the first conductive member includes: a film disposed at a front side of the plasma display panel and having a conductive layer; and a frame-shaped metal member connected electrically to a peripheral portion of the film, and
    the second conductive member is a back cover disposed at a rear side of the plasma display panel.

* * * * *